United States Patent
Orlowski et al.

(10) Patent No.: US 7,339,241 B2
(45) Date of Patent: Mar. 4, 2008

(54) FINFET STRUCTURE WITH CONTACTS

(75) Inventors: Marius K. Orlowski, Austin, TX (US); Tab A. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 178 days.

(21) Appl. No.: 11/216,974

(22) Filed: Aug. 31, 2005

(65) Prior Publication Data

US 2007/0045735 A1   Mar. 1, 2007

(51) Int. Cl.
H01L 29/76 (2006.01)
H01L 29/94 (2006.01)
H01L 31/00 (2006.01)

(52) U.S. Cl. .............................. 257/401; 257/E29.022; 257/E29.135

(58) Field of Classification Search ...................... None
See application file for complete search history.

(56) References Cited

U.S. PATENT DOCUMENTS

| | | | |
|---|---|---|---|
| 6,483,156 B1 * | 11/2002 | Adkisson et al. | 257/401 |
| 6,563,131 B1 * | 5/2003 | Adkisson et al. | 257/20 |
| 6,765,303 B1 * | 7/2004 | Krivokapic et al. | 257/347 |
| 6,885,055 B2 * | 4/2005 | Lee | 257/308 |
| 7,013,447 B2 * | 3/2006 | Mathew et al. | 716/11 |
| 7,122,412 B2 * | 10/2006 | Chen et al. | 438/157 |
| 7,163,864 B1 * | 1/2007 | Adkisson et al. | 438/269 |
| 2002/0153587 A1 * | 10/2002 | Adkisson et al. | 257/510 |
| 2005/0020015 A1 * | 1/2005 | Mathew et al. | 438/277 |
| 2005/0026343 A1 * | 2/2005 | Quek et al. | 438/197 |
| 2007/0001219 A1 * | 1/2007 | Radosavljevic et al. | 257/327 |

OTHER PUBLICATIONS

K.G. Anil et al, "Layout Density Analysis of FinFETs", ESSDERC Conference Proceedings 2003, pp. 139-142.
Y. Liu et al, "Systematic Electrical Characteristics of Ideal Rectangular Cross Section SiFin Channel Double-Gate MOSFETs" IEEE Trans. On Nanotechnology, vol. 2, p. 198-204.
H. Aanathan et al, "FinFET SRAM—Device and Circuit Design Considerations", Quality Electronic Design, 2004. 5th International Symposium 2004, pp. 511-516.

* cited by examiner

*Primary Examiner*—Evan Pert
*Assistant Examiner*—Ben P Sandvik
(74) *Attorney, Agent, or Firm*—James L. Clingan, Jr.; David G. Dolezal

(57) ABSTRACT

A FinFET, which by its nature has both elevated source/drains and an elevated channel that are portions of an elevated semiconductor portion that has parallel fins and one source/drain on one side of the fins and another source/drain on the other side of the fins, has all of the source/drain contacts away from the fins as much as reasonably possible. The gate contacts extend upward from the top surface of the elevated semiconductor portion. The gate also extends upward from the top surface of the elevated semiconductor portion. The contacts are located between the fins where the gate is below the height of the elevated semiconductor portion so the contacts are as far as reasonably possible from the gate, thereby reducing gate to drain capacitance and providing additional assistance to alignment tolerance.

11 Claims, 3 Drawing Sheets

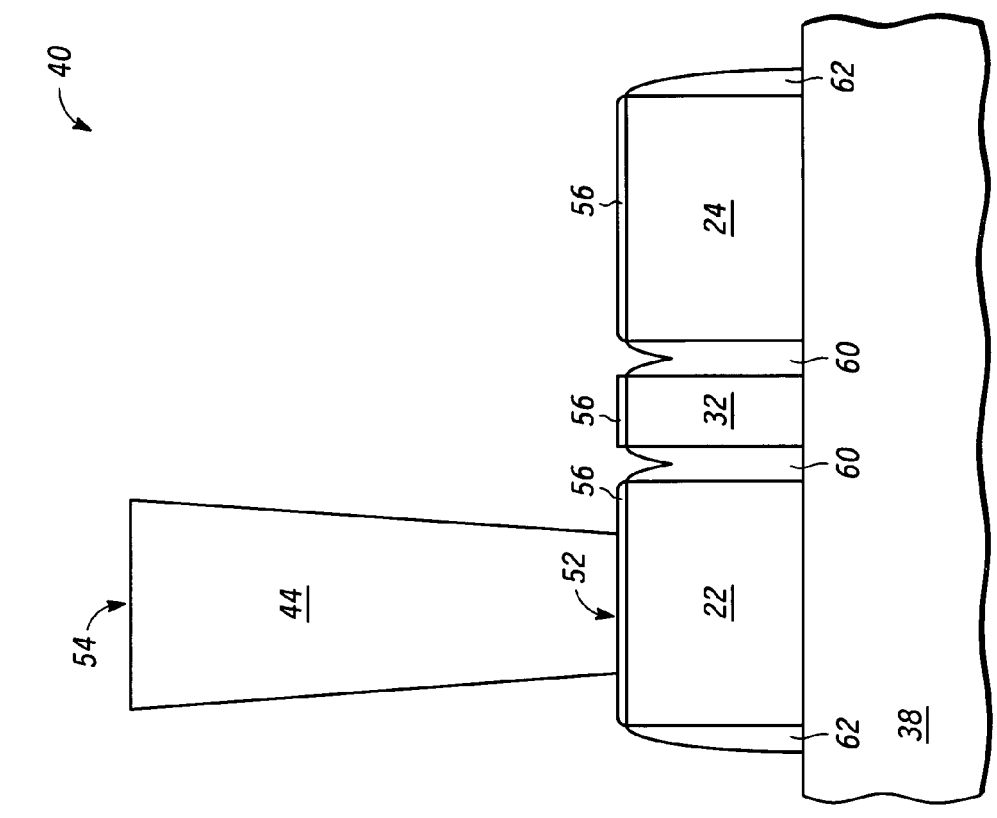
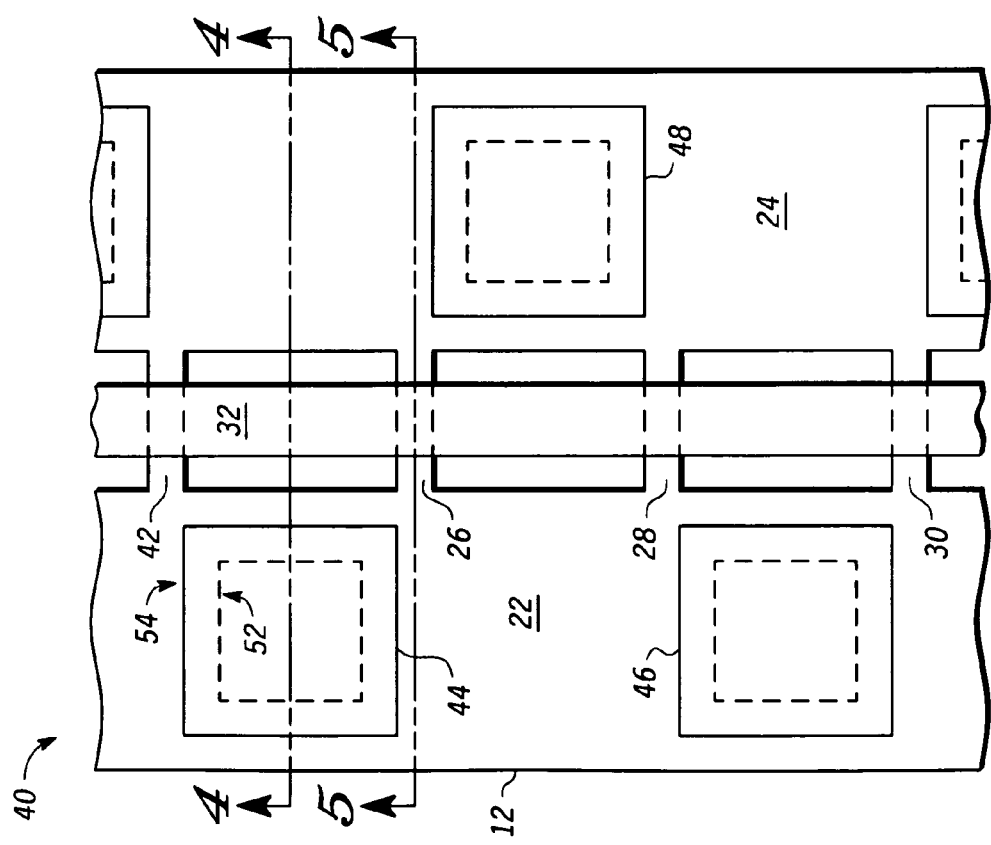

FINFET STRUCTURE WITH CONTACTS

FIELD OF THE INVENTION

This invention relates to FinFETs, and more particularly to FinFETs with contacts.

BACKGROUND OF THE INVENTION

FinFET technology has shown great promise in improving transistor density and reduced source/drain leakage while maintaining needed performance requirements. This uses a semiconductor structure elevated above a substrate floor. The channel portion itself resembles a fin so the name FinFET has been used. A gate overlies the fin and the width of the gate in this structure determines the channel length. The height of the fin and the number of fins determines the channel width. This results in improved density. In this structure the gate is effective on two sides of the fin resulting in two channels for each fin. The fin is also sufficiently thin that the entire thickness of the fin is under the influence of the gate. This results in reduced source/drain leakage.

The FinFET technology, however, is still not competitive with planar transistor technology in the marketplace where performance and manufacturability are critical. Much improvement in this area is necessary before FinFETs will be appearing in actual products.

Thus there is a need for improving the performance and manufacturability of FinFETs.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings:

FIG. 3 is a top view of a FinFET according to an embodiment of the invention;

FIG. 4 is a cross section of the FinFET of FIG. 3 taken at one location;

DETAILED DESCRIPTION OF THE INVENTION

In one aspect a FinFET, which by its nature has both elevated source/drains and an elevated channel that are part of an elevated semiconductor portion that has parallel fins and one source/drain on one side of the fins and another source/drain on the other side of the fins, has all of the source/drains contacts away from the fins as much as reasonably possible. The gate contacts extend upward from the top surface of the elevated semiconductor portion. The gate also extends upward from the top surface of the elevated semiconductor portion. The contacts are located between the fins where the gate is below the height of the elevated semiconductor portion so the contacts are as far as reasonably possible from the gate, thereby reducing gate to drain capacitance and providing additional assistance to alignment tolerance. This is better understood by reference to the drawings and the following description.

Figure 1:
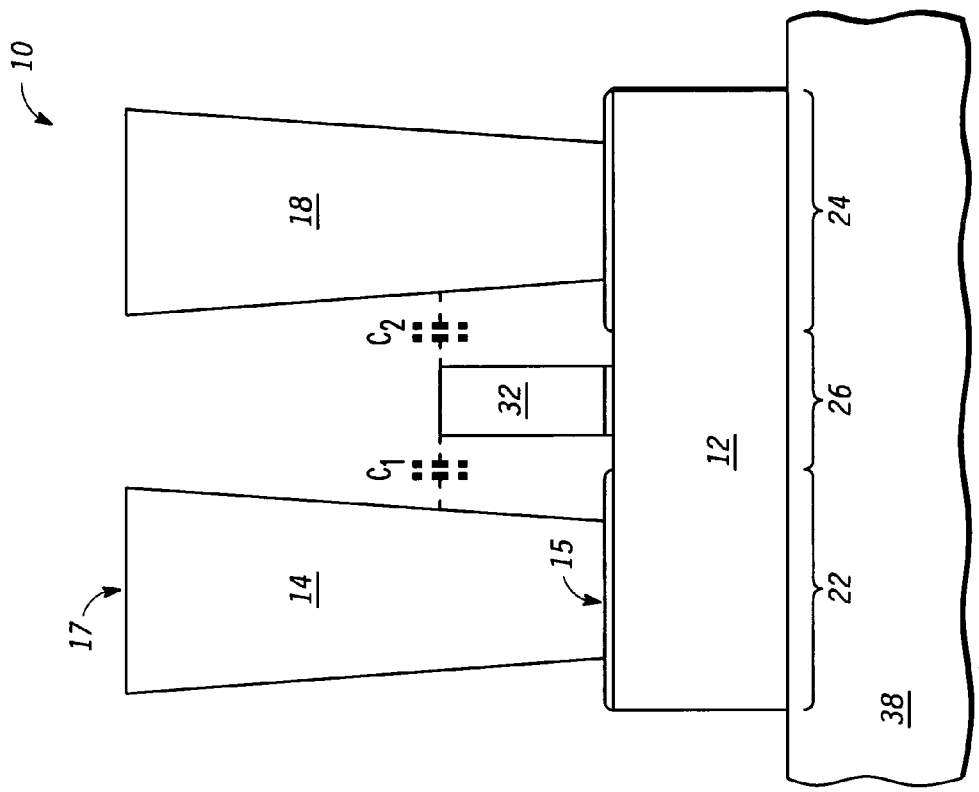
FIG. 1 is a top view of a FinFET useful in demonstrating a problem that has been discovered in performance and manufacturability.
Figure 2:
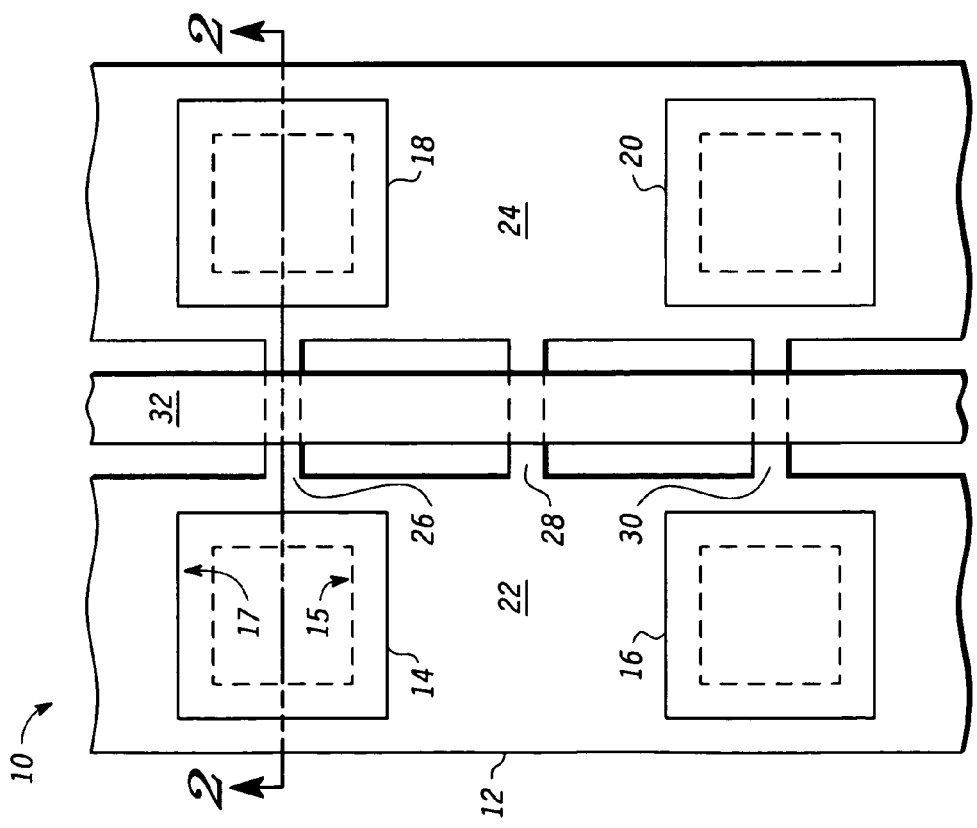
FIG. 2 is a cross section of the FinFET of FIG. 1.

Shown in FIG. 1 is a FinFET structure 10, a type of semiconductor device, shown from a top view comprising an elevated semiconductor portion 12 having a source/drain region 22 on one side, a source/drain region 24 on the other side, and semiconductor fins 26, 28, and 30. Source/drain regions can be considered current electrodes. The elevated source/drains plus fins can be considered a semiconductor structure. Since increasing the number of fins is the way of increasing the effective channel width, in any integrated circuit with FinFETs, transistors will typically have multiple fins. On source/drain region 22 are contacts 14 and 16. On source/drain region 24 are contacts 18 and 20. Contacts 14, 16, 18, and 20, by making physical contact, make electrical contact. A gate 32 runs over and between fins 26, 28, and 30. Contacts 14, 16, 18, and 20 are not perfectly vertical but extend outward as they rise. While problems exist for vertical contacts, these problems are exacerbated as the contacts become more tapered. In this example, elevated semiconductor portion 12 is silicon, but other semiconductor materials could be used. Contacts 14, 16, 18, and 20 are preferably tungsten with a silicide bottom to interface with elevated semiconductor portion 12. The silicide bottoms are formed by siliciding the source/drains. Metal is then applied in holes over the silicide regions to make physical contact with these silicide regions and complete the contact formation. The upper dimension of contact 14 is an area 17 which tapers to a lower dimension shown as area 15. Area 15 resides on the silicided portion of the source/drain region 22. As an alternative view, the contacts could simply be considered the region between the upper dimension and the lower dimension and the silicided region could be considered separate from the contact. Gate 32 is preferably polysilicon because of the very conformal deposition characteristic of polysilicon. Other materials may also be used, especially metal if it can in fact be deposited effectively. The particular dimensions of the features will vary based on the particular technology being used and the design choices. The dimensions used in this example are as follows:

Fin height: 100 nanometers (nm)
Gate width: 40 nm
Fin pitch: 140 nm
Source/drain width: 150 nm
Contact lower dimension: 90×90 nm
Contact upper dimension: 120×120 nm
Fin length (between source/drain regions): 80 nm
Fin width: 20 nm
Gate height: 100 nm Shown in FIG. 2 is FinFET structure 10 in a cross section taken through contacts 14 and 18 and fin 26. FIG. 2 shows that elevated semiconductor portion 12 is on a substrate 38. Substrate 38 is preferably an insulator such as silicon oxide. The top surface of substrate 38 is considered horizontal so that any direction parallel to the top surface of substrate 38 is also considered horizontal. Shown in FIG. 2 is that gate contacts 14 and 18 angularly become closer to gate 32 as they rise from elevated semiconductor portion 12. This shows the lower dimension 15 of contact 14 being smaller than an upper dimension 17 of contact 14. The portion of the contacts with the lower dimension is considered the base of the contact. Some features expected to be present, such as sidewall spacers, are not shown. A capacitance C1 is present between gate 32 and contact 14. Similarly, a capacitance C2 is present between gate 32 and contact 18. Both capacitance C1 and C2 add capacitive loading on the gate, which is an adverse effect. Gate to drain capacitance, however, has an effect that is generally even more adverse. Assuming source/ drain region 22 acts as the drain in a particular application, capacitance C1 increases the gate to drain capacitance. In operation of FinFET 10 as for transistors generally, the voltage change on the gate causes a change in voltage in the opposite direction on the drain. It is the speed with which the drain voltage responds to a change in gate voltage that determines the speed of operation. As a gate to drain capacitance, capacitance C1 works against this desired change because its effect is to move the drain voltage in the same direction as the gate voltage in opposition to the desired opposite direction.

An additional concern is that gate 32, with misalignment of contacts 14 and 18 as well as gate 32, the gate can come very close to one of contacts 14 and 18. This could become a leakage point or an exceedingly high adverse gate to drain capacitance. In viewing FIGS. 1 and 2 together, this close edge of gate 32 to contacts 14 and 18 is for the whole width of fin 26. This alignment of contacts 14 and 18 with fin 26 maximizes capacitance and the risk of misalignment becoming a problem. This alignment is a natural alignment based on the general concept of placing the contact facing the channel, but even if the contacts are randomly placed, this would occur often.

Shown in FIG. 3 is a FinFET structure 40 similar to FinFET 10 of FIG. 1 with differently placed contacts to avoid or reduce the negative impact of the contact placement used in FinFET 10. The elements that are the same retain the same numbers. In this example, contact to source/drain region 22 is made by contacts 44 and 46 being on source/ drain region 22. Contact to source/drain region 24 is made by contact 48 and other contacts only partially shown. Contacts 44, 46, and 48 are of same construction as contacts 14 and 16 but placed differently. In this case contact 44, exemplary of all of the contacts in this regard, has a lower dimension and an area 52 and a larger upper dimension of an area 54. In this example, an additional fin 42 is present and shown as being adjacent to fin 26. Contact 44 is centered between fins 42 and 26. Contact 46 is centered between fins 28 and 30, which are also adjacent fins. Although centering is desired, it is not perfectly achieved in an actual manufacturing context, especially repeatably. Accordingly, centered in this context means that it is centered using a reasonable application of the design and manufacturing constraints used in implementing the structure.

Shown in FIG. 4 is a cross section taken through the middle of contact 44 and between fins 42 and 26. This shows sidewall spacers 60 around gate 32 and sidewall spacer 62 around source/drain regions 22 and 24. Shown in FIG. 4 also is a silicide layer 56 that is over source/drain regions 22 and 24 and gate 32. Silicide layer 56 forms part of contact 44. This FIG. 4 shows that contact 44 is adjacent to gate 32 where gate 32 is between fins 42 and 26 so that gate 32 is below contact 44. The gate height in this example is the same as the fin and source/drain height. This shows that there is a much greater overall distance between contact 44 and gate 32 in the area between fins 42 and 26 than between gate 32 and contact 14 in FIG. 2. Accordingly, there is less capacitance for the case shown in FIG. 4. Also shown in FIG. 4 is that the contacts for source/drain region 22 are staggered with respect to the contacts for source/drain 24. This provides for more flexibility in making connections to the two source/drain regions 22 and 24. In this way, for example, parallel interconnect lines could run across Fin- FET structure 40 in the direction of the fins and separately contact source/drain regions 22 and 24.

Figure 5:
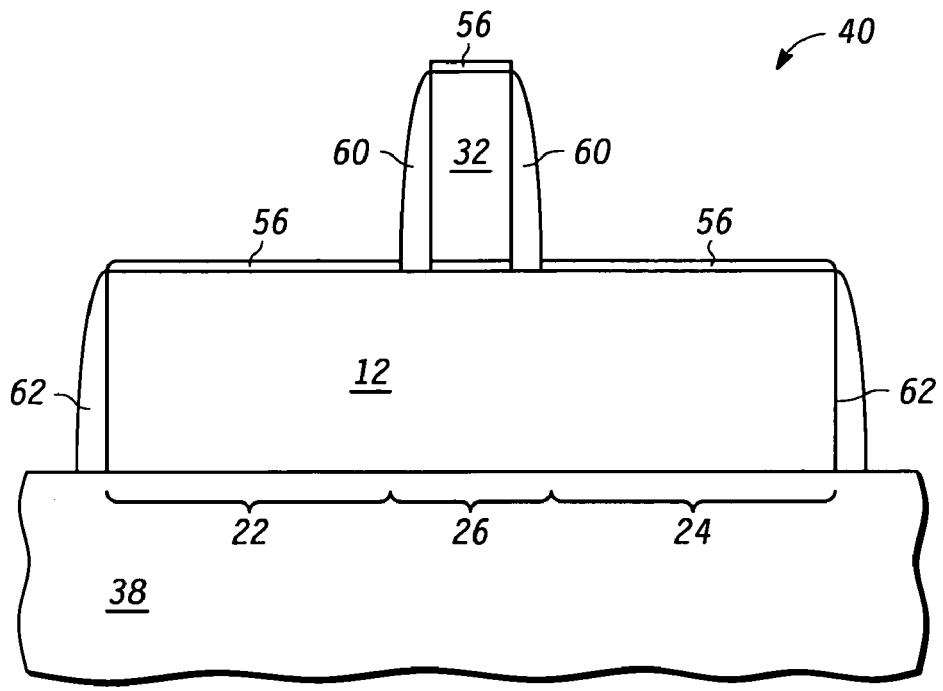
FIG. 5 is a cross section of the FinFET of FIG. 3 taken at another location.

Shown in FIG. 5 is a cross section through the middle of fin 26. FIG. 5 shows that there are no contacts adjacent to gate 32 where gate 32 is raised over fin 26. The area where gate 32 rises over the fin is where the particular vulnerability to increased capacitance and problems associated with misalignment occur. There is a still a corner of the contacts that is relatively close to the corner of the gate that is raised. For example, in FIG. 3 the corner of contact 44 closest to fin 26 is relatively close to gate 32 as it rises over fin 26. This is a relatively small area for increasing capacitance so the capacitance added at this corner is small compared to the capacitance added by contact 14 being along the whole side of fin 26 and thus the whole side of gate 32 that passes over fin 26. Also the corners of structures are rounded in actual manufacturing. Thus, there is actually more distance from the corner of contact 44 to the raised portion of gate 32 over fin 26 than it would appear from FIG. 3.

Figure 6:
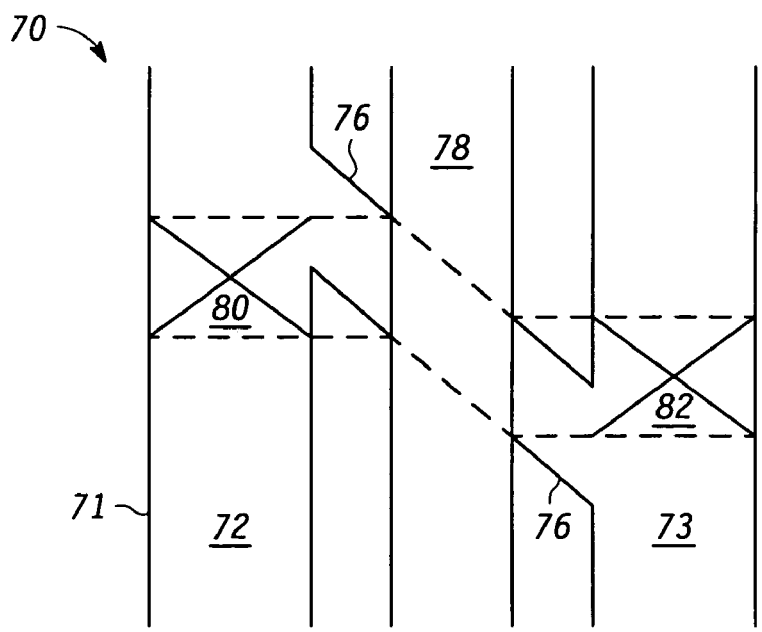
FIG. 6 is a top view of a FinFET according to an alternative embodiment.

An alternative is for fins to be at different angle than a 90 degree angle to the source/drain regions. In such case the point at which the gate rises over the fin will be somewhat offset from the point at which the fin intersects the source/ drain region. In such case the area where it is desirable to avoid having the contact is aligned to that region where the gate is over the fin. An example is shown in FIG. 6 in which there is a FinFET structure 70 having an elevated semiconductor region 71 having a source/drain region 72, a source/ drain region 73, and a fin 76 between source/drain regions 72 and 73. This shows fin 76 at angle to source/drain regions that is not 90 degrees. This is preferable when a particular crystal orientation is desired for a transistor type. For example, N channel transistors and P channel transistors may be optimized for performance using a different crystal orientation for the channel. A gate 78 overlies fin 76. Where gate 78 crosses fin 76 is the area where adjacent contact placement should be avoided. Extending perpendicular to source/drain region 72 are dotted lines extending from the points where gate 78 crosses over fin 76. These dotted lines define an area 80 on source/drain region 72 between them where a contact should be avoided. An "X" is placed in this area to show the region where contact should be avoided. Thus a contact should be centered between these areas along a given source/drain.

A similar region 82 on source/drain region 73 orthogonally aligned to the elevated portion of gate 78 should not have a contact.

This characterization is the same as for the orthogonal fin case shown in FIGS. 3-5, it is just that the "no-contact" area is the same as the area adjacent to the fin in those cases. But in both cases, FIGS. 3-5 and FIG. 6, it is the area in the source/drain region orthogonal to the sidewall of the portion of the gate that is over the fin that is the no-contact area. This portion of the source/drain region that is orthogonally adjacent to the elevated portion of the gate is considered a gate adjacent area. Thus the contacts should be placed between the boundaries of the gate adjacent areas. The actual portion of the contact that contacts the source/drain region is the base so it the base that is between the gate adjacent areas. In this case between means that either the base of the whole contact is outside the gate adjacent areas or is centered between two adjacent gate adjacent areas. Preferably, the contacts are completely outside of the gate adjacent areas, but there may be situations in which the contact is too big to achieve that. In such case it would still be preferable to minimize the encroachment into the gate adjacent areas so centering between the gate adjacent areas would be preferable.

Various other changes and modifications to the embodiments herein chosen for purposes of illustration will readily occur to those skilled in the art. Source/drains are also called current electrodes. A fin with source/drains is a semiconductor structure. To the extent that such modifications and variations do not depart from the spirit of the invention, they are intended to be included within the scope thereof which is assessed only by a fair interpretation of the following claims.

The invention claimed is:

1. A semiconductor device comprising:
    a semiconductor structure located over a dielectric, wherein the semiconductor structure includes:
        a first current electrode portion running generally in a first horizontal direction;
        a second current electrode portion running generally in the first horizontal direction;
        a plurality of fin portions, each fin portion located between the first current electrode portion and the second current electrode portion, each fin portion having a first side wall and a second side wall;
    a gate structure running generally in the first horizontal direction over the plurality of fin portions, wherein the gate structure has a first current electrode side sidewall and a second current electrode side sidewall;
    wherein each fin portion of the plurality of fin portions includes a first location of a plurality of locations where the first current electrode side sidewall overlies the fin portion;
    wherein the first current electrode portion includes a plurality of gate adjacent areas, wherein each gate adjacent area is defined as running in a second horizontal direction from a first location of the plurality of first locations, the second horizontal direction being orthogonal to the first horizontal direction;
    a plurality of contacts electrically contacting the first current electrode portion, each contact of the plurality of contacts has a base, wherein the base of each contact of the plurality of contacts is located over an area of the first current electrode portion between the areas of two adjacent gate adjacent areas of the plurality of gate adjacent areas;
    each fin portion of the plurality of fin portions includes a second location of a plurality of second locations where the second current electrode side sidewall overlies the fin portion;
    the second current electrode portion includes a second plurality of gate adjacent areas, wherein each gate adjacent area of the second plurality of gate adjacent areas is defined as running in a second horizontal direction from a second location of the plurality of second locations; and
    a second plurality of contacts electrically contacting the second current electrode portion, each contact of the second plurality of contacts has a base, wherein the base of each contact of the second plurality of contacts is located over an area of the second current electrode portion between two adjacent gate adjacent areas of the plurality of gate adjacent areas; and
    the plurality of electrical contacts is horizontally staggered with the second plurality of electrical contacts.

2. The semiconductor device of claim 1 wherein all of the base of each contact of the plurality of contacts is located over an area of the first current electrode portion other than the areas of the plurality of gate adjacent areas.

3. The semiconductor device of claim 1 wherein the each of the plurality of fin portions runs generally in the second horizontal direction.

4. The semiconductor device of claim 1 wherein each contact of the plurality of contacts is located on and electrically connected to silicide material located on and electrically connected to the first current electrode structure.

5. The semiconductor device of claim 1 wherein:
    each fin portion of the plurality of fin portions includes a channel region of a plurality of channel regions;
    the movement of carriers of in each channel region of the plurality of channel regions during operation is generally horizontal in direction.

6. The semiconductor device of claim 1 wherein the base of each contact of the plurality of contacts is located over an area of the first current electrode portion that is centered between two adjacent gate adjacent areas of the plurality of gate adjacent areas.

7. A semiconductor device comprising:
    a semiconductor structure located over a dielectric, wherein the semiconductor structure includes:
        a first current electrode portion running generally in a first horizontal direction;
        a second current electrode portion running generally in the first horizontal direction;
        a plurality of fin portions, each fin portion located between the first current electrode portion and the second current electrode portion, each fin portion having a first side wall and a second side wall;
    a gate structure running generally in the first horizontal direction over the plurality of fin portions, wherein the gate structure has a first current electrode side sidewall and a second current electrode side sidewall;
    wherein each fin portion of the plurality of fin portions includes a first location of a plurality of locations where the first current electrode side sidewall overlies the fin portion;
    wherein the first current electrode portion includes a plurality of gate adjacent areas, wherein each gate adjacent area is defined as running in a second horizontal direction from a first location of the plurality of first locations, the second horizontal direction being orthogonal to the first horizontal direction;
    a plurality of contacts electrically contacting the first current electrode portion, each contact of the plurality of contacts has a base, wherein the base of each contact of the plurality of contacts is located over an area of the first current electrode portion between the areas of two adjacent gate adjacent areas of the plurality of gate adjacent areas; and
    the plurality of fin portions each run in a third horizontal direction, wherein the third horizontal direction is non orthogonal to the first horizontal direction and non orthogonal to the second horizontal direction.

8. A semiconductor device comprising:
    a semiconductor structure located over a dielectric, wherein the semiconductor structure includes:
        a first current electrode portion running generally in a first horizontal direction;
        a second current electrode portion running generally in the first horizontal direction;
        a first fin portion located between the first current electrode portion and the second current electrode portion, the first fin portion includes a first side wall;
        a second fin portion located between the first current electrode portion and the second current electrode portion, the second fin portion includes a second side wall, the second side wall facing the first side wall with no portion of the semiconductor structure located there between;

a gate structure running generally in the first horizontal direction over the first fin portion and the second fin portion, wherein the gate structure has a first current electrode side sidewall and a second current electrode side sidewall;

wherein the first fin portion includes a first location where the first current electrode side sidewall overlies the first fin portion;

wherein the second fin portion includes a second location where the first current electrode side sidewall overlies the fin portion;

wherein the first current electrode portion includes a first gate adjacent area defined as running in a second horizontal direction from the first location, the second horizontal direction being orthogonal to the first horizontal direction;

wherein the first current electrode portion includes a second gate adjacent area defined as running in the second horizontal direction from the second location;

a current electrode contact having a base in electrical contact with the first current electrode portion, wherein the base is located over an area of the first current electrode portion at a location between the first gate adjacent area and the second gate adjacent; and a first gate structure including a first gate portion located over the first fin portion, a second gate portion located over the second fin portion, and a third gate portion located between the first side wall of the first fin portion and the second sidewall of the second fin portion, wherein a top of the first gate portion and a top of the second gate portion are vertically separated by a greater distance from the dielectric than a top portion of the third gate portion.

9. A semiconductor device of claim 8 further comprising:

a third fin portion located between the first current electrode portion and the second current electrode portion, the third fin portion includes a third side wall;

a fourth fin portion located between the first current electrode portion and the second current electrode portion, the fourth fin portion includes a fourth side wall, the fourth sidewall facing the third sidewall with no portion of the semiconductor structure located there between;

wherein the third fin portion includes a third location where the first current electrode side sidewall overlies the third fin portion;

wherein the fourth fin portion includes a fourth location where the first current electrode side sidewall overlies the fourth fin portion;

wherein the first current electrode portion includes a third gate adjacent area defined as running in a second horizontal direction from the third location;

wherein the first current electrode portion includes a fourth gate adjacent area defined as running in the second horizontal direction from the fourth location;

a second current electrode contact having a base in electrical contact with the first current electrode portion, wherein the base is located over an area of the first current electrode portion at a location between a third gate adjacent area and the fourth gate adjacent area.

10. A semiconductor device of claim 8 further comprising:

a third fin portion located between the first current electrode portion and the second current electrode portion, the third fin portion includes a third side wall;

a fourth fin portion located horizontally between the first current electrode portion and the second current electrode portion, the fourth fin portion includes a fourth side wall, the fourth sidewall facing the third side wall with no portion of the semiconductor structure located there between, wherein the third fin portion includes a third location where the second current electrode side sidewall overlies the third fin portion;

wherein the fourth fin portion includes a fourth location where the second current electrode side sidewall overlies the fin portion;

wherein the second current electrode portion includes a third gate adjacent area defined as running in a second horizontal direction from the third location;

wherein the second current electrode portion includes a fourth gate adjacent area defined as running in the second horizontal direction from the fourth location;

a second current electrode contact having a base in electrical contact with the second current electrode portion, wherein the base is located over an area of the second current electrode portion at a location between a third second gate adjacent area and the fourth gate adjacent area.

11. The semiconductor device of claim 8 wherein:

the first fin portion includes a first channel;

the second fin portion includes a second channel;

the movement of carriers in the first channel and in the second channel during operation is generally horizontal in direction.

* * * * *